(12) United States Patent
Humphrey

(10) Patent No.: US 6,982,614 B2
(45) Date of Patent: Jan. 3, 2006

(54) MULTI-MODE FILTER

(75) Inventor: Denver Humphrey, Broughshane Co. Antrim (GB)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/768,954

(22) Filed: Jan. 29, 2004

(65) Prior Publication Data

US 2004/0246074 A1    Dec. 9, 2004

(30) Foreign Application Priority Data

Feb. 20, 2003 (EP) .................................. 03003810

(51) Int. Cl.
*H03H 7/00* (2006.01)

(52) U.S. Cl. ...................................... 333/174; 333/175

(58) Field of Classification Search ................ 333/167, 333/174–176; 455/191.3, 193.2
See application file for complete search history.

(56) References Cited

U.S. PATENT DOCUMENTS

| | | | | | |
|---|---|---|---|---|---|
| 3,582,835 | A | * | 6/1971 | Walding | 333/174 |
| 4,153,887 | A | * | 5/1979 | Poppa | 333/172 |
| 4,571,560 | A | * | 2/1986 | Dobrovolny | 333/174 |
| 5,065,120 | A | | 11/1991 | Munn | |
| 6,064,866 | A | * | 5/2000 | Lange | 455/180.1 |
| 6,134,427 | A | * | 10/2000 | Hughes | 455/269 |
| 6,195,536 | B1 | | 2/2001 | Peckham et al. | |
| 6,856,213 | B2 | * | 2/2005 | Tsurunari et al. | 333/133 |

FOREIGN PATENT DOCUMENTS

| DE | 19 09 244 A1 | 5/1970 |
|---|---|---|
| EP | 0 818 888 A1 | 1/1998 |

OTHER PUBLICATIONS

James J. Komiak et al., "High Efficiency Wideband 6 to 18 GHz PHEMT Power Amplifier MMIC", 2002 IEEE, pp. 905–908.

* cited by examiner

*Primary Examiner*—Seungsook Ham
(74) *Attorney, Agent, or Firm*—Darby & Darby

(57) ABSTRACT

The invention provides a filter network comprising a plurality of circuit branches, each circuit branch comprising one or more filter elements. At least one of the circuit branches comprises a resonant circuit and is preferably arranged between the circuit path and ground. The filter network further comprises a switch device associated with the resonant circuit, the switch device being operable between an on state, in which the resonant circuit is connected to said circuit path, and an off state in which the resonant circuit is substantially isolated from said circuit path. The filter network also includes a switch control input for receiving a signal for operating the switch device between the on and off states. Switching in and out the resonant circuit changes the operational characteristics of the filter.

22 Claims, 7 Drawing Sheets

MULTI-MODE FILTER

FIELD OF THE INVENTION

The present invention relates to multi-mode filters, particularly radio frequency (RF) filters.

BACKGROUND TO THE INVENTION

In many RF applications, there is a requirement for RF circuitry to operate in more than one frequency band. For example in the field of mobile telecommunications, mobile, or cellular, telecommunications networks may be operable in more than one frequency band and/or the frequency band(s) used by mobile telecommunications networks may vary from country to country. Accordingly, mobile, or cellular, telephones are commonly arranged for operation in more than one frequency band. In this connection, four frequency bands in current use in the mobile telecommunications market are GSM (Global System for Mobile telecommunications—approx. 890 to 960 MHz), AGSM (American GSM—approx. 824 to 849 GHz), DCS (Digital Communication System—approx. 1.71 to 1.88 GHz) and PCS (approx. 1850 to 1910 MHz).

RF signals received by, or produced by, RF circuitry normally require filtering to remove, or attenuate, any signals or signal components (typically harmonic or sub-harmonic components) in unwanted frequency bands.

Conventionally, where RF circuitry is capable of operating in more than one frequency band, a respective filter network, or filter, is employed to perform the required filtering in respective frequency bands. For example, a dual band transmitter commonly comprises two separate signal paths, each path comprising a respective power amplifier for amplifying signals in a respective frequency band. Each path further comprises a respective filter for attenuating unwanted harmonic signals around the respective frequency bands. Hence, two separate filters are required even though normally only one is in use at any given time.

For many applications, for example mobile or cellular telephones, size is an important consideration and it would be desirable therefore to reduce the amount of filtering circuitry required, preferably by eliminating the need to use more than one filter. Moreover, the arrangement described above does not lend itself for use with dual, or multi, band apparatus where a single-input, single-output amplifier (sometimes referred to as a broadband or wideband amplifier) is used to amplify signals in all operating frequency bands.

United States Patent U.S. Pat. No. 5,065,120 (Munn) discloses a bandpass filter in which a capacitance is selectively switched to ground in order to affect a change in the centre frequency of the passband response of the filter. Hence, depending on the switch setting, the bandpass response of the Munn filter can be tuned to pass signals in one or other of two selectable passbands. One limitation of the Munn filter is that it operates as a band pass filter in each mode of operation. A band pass filter response is not suitable in applications where, for example, it is desired to pass all signals up to a given frequency. Moreover, it is considered that the extent to which the centre frequency of a Munn filter could be moved between modes is relatively limited and this in turn limits the application of the Munn filter.

United States Patent U.S. Pat. No. 6,195,536 (Peckham) discloses a low pass filter in which the low pass bandwidth can be adjusted by selectably biasing a plurality of diodes. One limitation of the Peckham filter is that it always acts as a low pass filter and this is not suitable for applications where, for example, it is desired to suppress signals, such as sub-harmonics, which occur at a frequency lower than the normal operating frequency band. Moreover, the Peckham filter is only suitable for use in applications where specific and non-commonplace impedance matching conditions are met.

It would be desirable therefore to provide a filter that is capable of operating in two or more frequency bands selectively and which is more versatile than the filters described above. It would also be desirable for the filter to be suitable for use with a single-input, single output multi-band amplifier.

SUMMARY OF THE INVENTION

Accordingly, the present invention provides a filter network comprising an input for receiving a signal to be filtered, an output for providing a filtered signal, and a plurality of circuit branches associated with a circuit path between the input and the output, each circuit branch comprising one or more filter elements and at least one of said circuit branches being associated with a switch device, the switch device being operable between an on state, in which said at least one circuit branch is connected to said circuit path, and an off state in which said at least one circuit branch is substantially isolated from said circuit path; and a switch control input for receiving a signal for operating the switch device between the on and off states, wherein said at least one circuit branch comprises a resonant circuit.

Hence, by switching out or switching in said at least one circuit branch, the filter network is operable in a first or a second operating mode. The filter is thus able to filter signals in different frequency bands depending on the mode of operation. The mode of operation is selected by the signal received at the switch control input.

Preferably, said at least one circuit branch is arranged between the circuit path and ground.

Preferably, said switch device comprises a diode and said switch control input is arranged to receive a bias voltage signal for turning the diode on or off. More preferably, said switch device is provided between said at least one circuit branch and said circuit path.

Preferably, said at least one circuit branch comprises a capacitive element and an inductive element arranged in parallel with one another.

In the preferred embodiment, the filter network is arranged to pass, when in one mode of operation, signals which are received at said input in a first frequency band, wherein the respective values of capacitance and inductance of the respective filter elements in the resonant circuit are selected to cause said resonant circuit to resonate in said first frequency band. Preferably, said capacitance and inductance values are selected by designing the resonant circuit as at least part of a band stop filter in which the stop band substantially comprises said first frequency band.

Preferably, the filter network includes a filter portion arranged to behave as a low pass filter for passing signals of frequencies up to and including a cut-off frequency.

In the preferred embodiment, the filter network is operable in a first mode, corresponding to when the switch device is on, in which the filter network behaves as a band pass filter passing signals in said first frequency band, and a second mode, corresponding to when the switch device is off, in which the filter network behaves as a low pass filter passing signals up to and including said cut-off frequency. Preferably, the first frequency band is lower than the cut-off frequency.

Preferably, the respective resonant circuits of the first and second circuit branches are arranged to resonate in substantially the same frequency band. Alternatively, the resonant circuits of the first and second circuit branches are arranged to resonate in respective frequency bands, the frequency bands being adjacent or partly overlapping.

A second aspect of the invention provides a multi-band transmitter comprising a single-input, single-output multi-band power amplifier arranged to receive and amplify signals in more than one operational frequency band, and a filter network according to the first aspect of the invention.

A third aspect of the invention provides a method of designing a filter network, the method including selecting the respective values of capacitance and inductance of the respective filter elements in the resonant circuit to cause said resonant circuit to resonate in said first frequency band. Preferably, the method includes selecting said capacitance and inductance values by designing the resonant circuit as at least part of a band stop filter in which the stop band substantially comprises said first frequency band.

Other preferred features of the invention are recited in the dependent claims and other advantageous aspects of the invention will be appreciated by those ordinarily skilled in the art upon review of the following description and accompanying drawings.

BRIEF DESCRIPTION OF THE DRAWINGS

Embodiments of the invention are hereinafter described by way of example and with reference to the accompanying drawings in which like numerals are used to indicate like parts and in which.

DETAILED DESCRIPTION OF THE DRAWINGS

Typically, analogue filters comprise a series of circuit branches connected in series or in shunt with a circuit path between a signal source and a signal destination, or load. Branches that are connected in shunt are typically connected between a point on the circuit path and ground (earth). The branches may comprise resistive, capacitive and/or inductive elements in series or in parallel. Circuits which comprise a capacitance and an inductance in parallel or in series are known as resonant circuits, or resonators, and are commonly used as circuit branches of analogue filters. There are many different types of filter network, such as Chebyshev filter networks and Butterworth filter networks. Computer programs, such as the E-Syn (trade mark) computer aided synthesis program as provided by Agilent EEsof (http://eesof.tm.agilent.com), are available which allow filters, including Chebyshev and Butterworth filters, to be designed by specifying one or more parameters such as −3 dB cut-off point(s), number of resonators, and/or level of attenuation at specified frequency bands. Once designed, conventional filter circuits are static in that they are dedicated to filtering signals in accordance with the parameters specified during the design of the filter.

Figure 1:
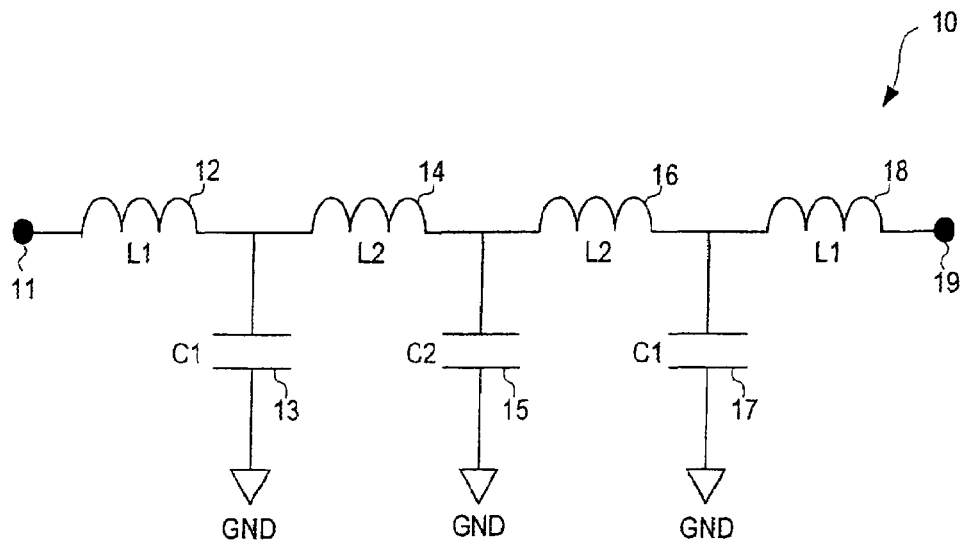
FIG. 1 is a schematic diagram of a Chebyshev low pass filter network.

Referring firstly to FIG. 1 of the drawings, there is shown, generally indicated at 10, a filter network. The filter network 10, which may also be referred to as a filter circuit or simply a filter, comprises a plurality of filter elements in the form of analogue circuit components, in particular capacitors and inductors. The filter network 10 is arranged to receive an input signal (not shown) at input 11 and to provide a filtered output signal (not shown) at output 19. Typically, the input signal comprises more than one frequency component, the purpose of the filter network 10 being to remove, or attenuate, one or more unwanted frequency components from the input signal. The input signal is assumed hereinafter for the purposes of example to comprise a radio frequency (RF) signal having one or more frequency components in one or more respective RF frequency bands.

The filter network 10 is arranged to serve as a low pass filter. The configuration of the circuit components of the filter network 10 conform with an arrangement designed as a Chebyshev low pass filter topology and so filter 10 may be referred to as a Chebyshev low pass filter. The filter network 10 comprises a series of circuit branches connected alternately in series in a circuit path between the input 11 and the output 19, or in shunt (i.e. between a point on the circuit path and ground GND). In the low pass filter 10, each branch comprises a filter element in the form of a capacitor or an inductor. In FIG. 1, the first branch of filter 10 comprises a series inductor 12 of inductance L1, the second branch comprises a shunt capacitor 13 of capacitance C1, the third branch comprises a series inductor 14 of inductance L2, the fourth branch comprises a shunt capacitor 15 of capacitance C2, the fifth branch comprises a series inductor 16 of inductance L2, the sixth branch comprises a shunt capacitor 17 of capacitance C1 and the seventh branch comprises a series inductor 18 of inductance L1.

Figure 2:
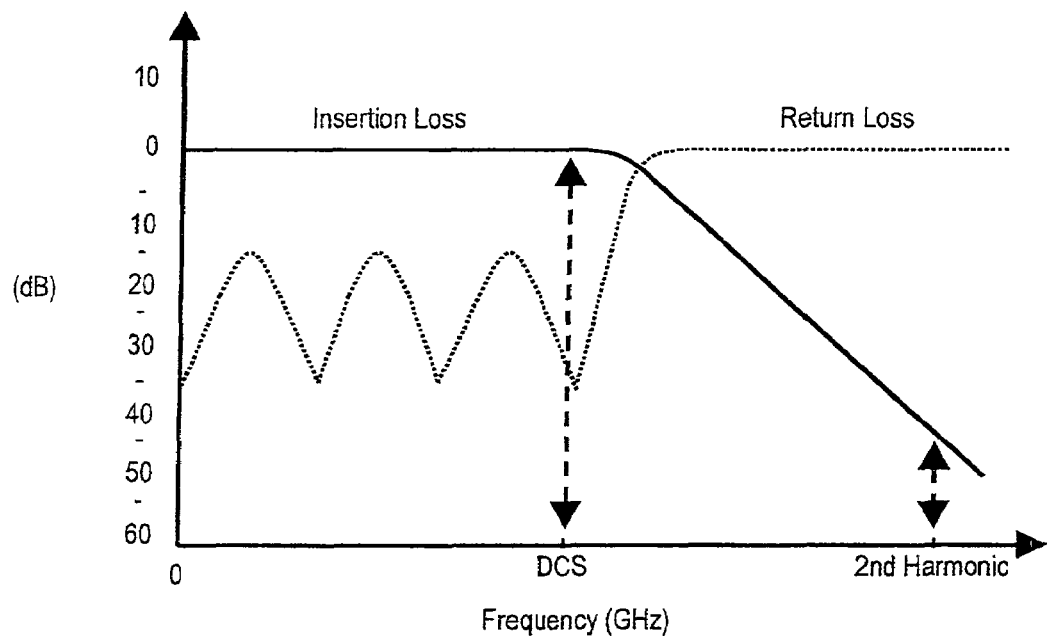
FIG. 2 is a plot illustrating the response of the filter network of FIG. 1.

FIG. 2 shows a plot of a typical frequency response of the filter 10 in terms of Insertion Loss and Return Loss (in decibels) against frequency (in gigahertz). It is assumed that the circuit components 12–18 of filter 10 are selected to allow signals up to and including the DCS frequency band (approx. 1.8 GHz) to pass, while attenuating higher frequency signals, or signal components. In the example shown in FIG. 2, it will be seen from the attenuation plot that the 3 dB cut-off point occurs at approximately 1.92 GHz and it will be seen in particular that the second harmonic component of a DCS signal (approx. 3.42 GHz) is subject to high attenuation (approx. −54 dB) and so is effectively removed from the input signal.

Figure 3:
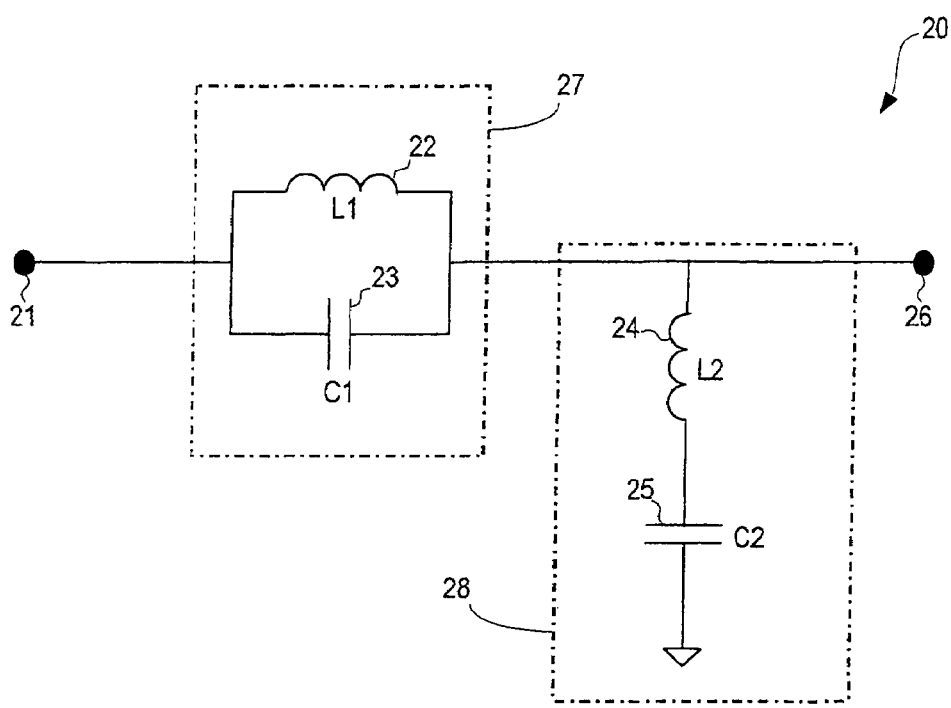
FIG. 3 is a schematic diagram of a Butterworth band stop filter network.

FIG. 3 shows, generally indicated as 20, a different type of filter network. The filter network 20 comprises a plurality of filter elements in the form of capacitors and inductors. The filter network 20 is arranged to receive an input signal (not shown) at input 21 and to provide a filtered output signal (not shown) at output 26. As before, the input signal typically comprises more than one frequency component and is assumed hereinafter to comprise a radio frequency (RF) signal.

The filter network 20 is arranged to serve as a band stop filter. The configuration of the circuit components of the filter network 20 conform with an arrangement designed as a Butterworth band stop filter topology and so filter 20 may be referred to as a Butterworth band stop filter. The filter network 20 comprises a series of circuit branches 27, 28 connected alternately in series in a circuit path between the input 21 and the output 26, or in shunt (i.e. between a point on the circuit path and ground GND). In the filter 20, each branch comprises a capacitor and an inductor. In FIG. 3, the first branch 27 of filter 20 comprises a resonant circuit comprising an inductor 22 of inductance L1 in parallel with a capacitor 23 of capacitance C1, and the second branch 28 comprises an inductor 24 of inductance L2 in series with a capacitor 25 of capacitance C2, both of which are in shunt with respect to the circuit path between input 21 and output 26.

Figure 4:
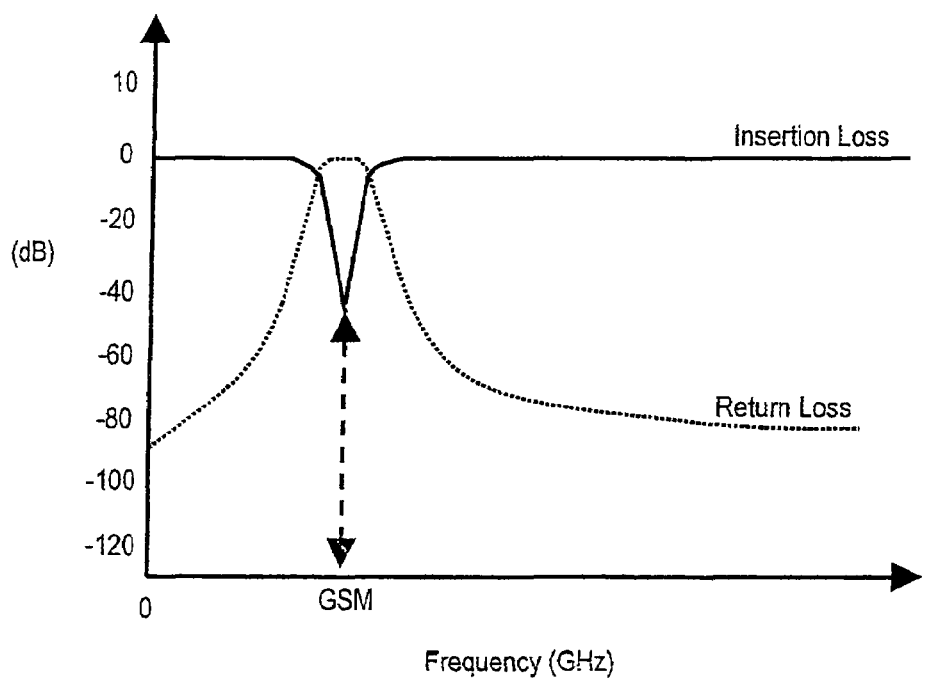
FIG. 4 is a plot illustrating the response of the filter network of FIG. 3.

FIG. 4 shows a plot of a typical frequency response for filter 20 in terms of both Insertion Loss and Return Loss (in decibels) against frequency (in gigahertz). In the present example the circuit components 22–25 of filter 20 are selected to stop (i.e. attenuate) signals in the GSM frequency band (approx. 900 MHz), while allowing other frequency signals, or signal components to pass.

The filters 10, 20 are static in that they are only able to perform signal filtering in accordance with the response characteristics illustrated in FIGS. 2 and 4 respectively. In accordance with one aspect of the invention, a filter, or filter network is provided wherein one or more of the circuit branches comprising a resonant circuit may be selectably isolated, or effectively removed, from the filter network in order to alter the response characteristics of the filter. In the preferred embodiments of the invention illustrated in FIGS. 5 and 8, it is assumed, by way of example, that a dual mode filter is required which is configurable to operate in a first mode in which it serves as a low pass filter, and a second mode in which it serves as a band pass filter. For the purposes of illustration, when operating in the low pass mode, the filter is required to pass signals of frequency up to and including a cut-off frequency which in this case is defined by the upper limit of the DCS band, while in the second mode, the filter is required to pass signals in a first frequency band, namely the GSM frequency band.

Figure 5:
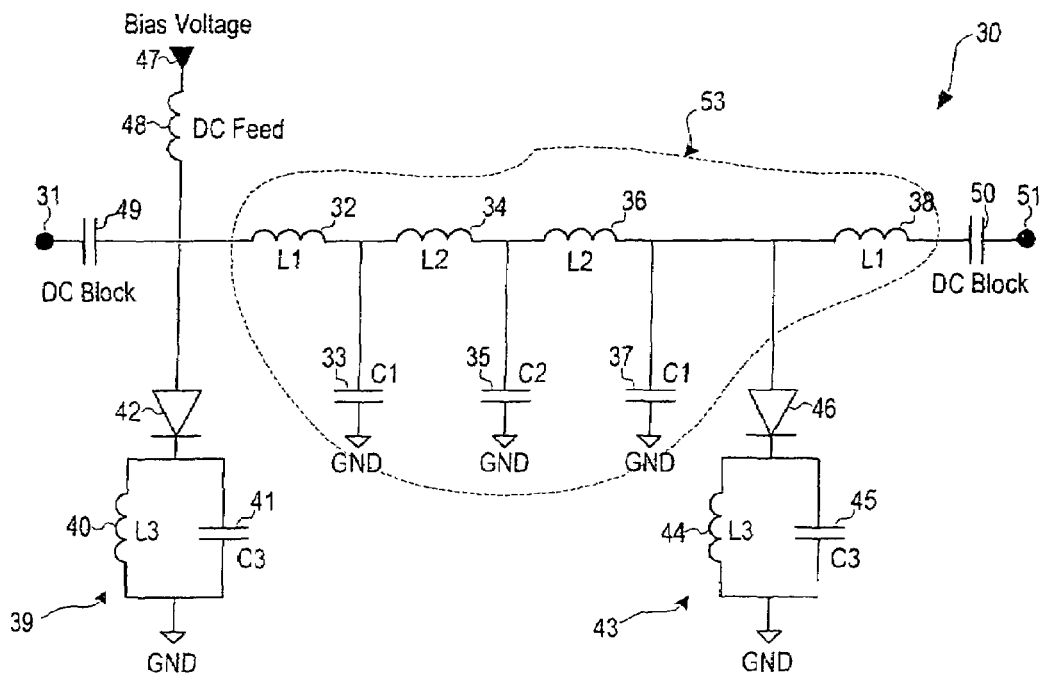
FIG. 5 is a schematic diagram of a first embodiment of a filter network according to the invention.

Referring now to FIG. 5 there is shown, generally indicated at 30, a first embodiment of a filter network, or filter, arranged in accordance with one aspect of the invention. The filter 30 is intended to suppress in particular harmonic components of RF signals. The filter 30 is arranged to receive an input signal, in particular an RF signal, (not shown) at input 31 and to provide a filtered output signal, in particular a filtered RF signal, (not shown) at output 51. The filter 30 comprises a plurality of circuit branches included in a circuit path between the input 31 and the output 51 and arranged alternately in series or in shunt (i.e. between the circuit path and ground GND) with the circuit path. Each circuit branch comprises one or more filter elements in the form of a capacitor or an inductor. The filter 30 includes a filter portion (indicated by dashed line 53) which, in the present example, comprises seven circuit branches having a topology similar to that of the Chebyshev low pass filter 10 of FIG. 1, including inductors 32, 34, 36, 38 in series with the circuit path from input 31 to output 51, and capacitors 33, 35, 37 in shunt with respect to the circuit path.

The filter 30 further includes a first resonant circuit 39 comprising an inductor 40 of inductance L3 and a capacitor 41 of capacitance C3 in parallel (sometimes known as a parallel resonant circuit). The first resonant circuit 39 is preferably arranged in shunt with the circuit path between input 31 and output 51, i.e. is connected between a point on said circuit path and ground GND. A switch device, preferably in the form of a diode 42, is provided in the circuit branch which includes the first resonant circuit 39 and is arranged to selectably isolate, or effectively isolate, the resonant circuit 39 from the circuit path. In the preferred embodiment, diode 42 is connected between the resonant circuit 39 and the circuit path, the resonant circuit 39 being connected to the cathode of diode 42 and the anode of diode 42 being connected to the circuit path. In order to provide a bias voltage for the diode 42, the filter 30 is provided with a switch control input, or bias input 47. Preferably, an inductor 48 is connected in series with the bias input 47 in order to prevent the bias voltage signal applied at input 47 from affecting the operation of filter 30 on received RF signals. In the preferred embodiment, the first resonant circuit 39 is provided before the first branch of the filter portion 53 as shown in FIG. 5.

The filter 30 preferably also comprises a second resonant circuit, in the form of a parallel resonant circuit 43, comprising an inductor 44 of inductance L3 and capacitor 45 of capacitance C3 in parallel. The second resonant circuit 43 is preferably arranged in shunt with the circuit path between input 31 and output 51, i.e. is connected between a point on said circuit path and ground. The preferred arrangement is similar to that of the first resonant circuit 39 and so a second switch device, preferably in the form of diode 46, is provided between the second resonant circuit 43 and the circuit path between input 31 and output 51. The arrangement is such that a bias voltage applied at bias input 47 is not only applied to the first diode 42 but also to the second diode 46. The diodes 42, 46 are operable between an on state and an off state depending on the bias voltage. When an appropriate forward bias voltage is applied (which by way of example is approximately 0.6 volts for silicon based diodes), the diodes 42, 46 are switched on and, consequently, the respective resonant circuits 39, 43 are operational parts of filter 30 and therefore affect the performance of the filter 30. When no, or an insufficient, bias voltage is applied, the diodes 42, 46 are switched off and the respective resonant circuits 39, 43 are substantially, or effectively, isolated from the rest of the filter circuitry and do not appreciably affect its operation.

By way of example, the Hitachi HVD142 planar pin diode may be used as diodes 42, 46 where a d.c. bias voltage of 1 volt may be used to switch the diodes on, and 0 volts to switch the diodes 42, 46 off. Diodes do not normally exhibit ideal behaviour. For example, it is found that the Hitachi HVD142 planar pin diode presents a small capacitance when no bias voltage is applied, and a small inductance when a bias voltage is applied. Such non-ideal behaviour of diodes may readily be compensated for when selecting component values L1, L2, L3, C1, C2, C3 for filter 30.

In the preferred embodiment, a respective capacitor 49, 50 is provided in series with the input 31 and output 51 to serve as a d.c. block.

In a first mode of operation of filter 30, the diodes 42, 46 are switched off (which, in the preferred embodiment, corresponds to a bias voltage of 0 volts being applied to bias input 47) and the first and second resonant circuits 39, 43 do not appreciably affect the operation of the filter 30. Thus, filter portion 53 is the main operational part of filter 30 and, as can be appreciated by comparison with FIG. 1, filter portion 53 exhibits a topography of a low pass filter. Hence, in the first mode of operation filter 30 behaves as a low pass filter.

The respective values of components 32, 33, 34, 35, 36, 37, 38 are selected to provide the desired low pass filter response characteristics. In the present example, in the first mode of operation it is desired to pass signal frequencies up to and including the DCS frequency band. Using the E-Syn (trade mark) computer aided synthesis program to generate component values for the Chebyshev-type low pass filter topology exhibited by filter portion 53, approximate suitable component values are as follows: L1=5.222 nH; L2=9.2693 nH; C1=2.5161 pF; C2=2.7824 pF. For filter 30, a seven element Chebyshev design was implemented although it will be understood that the invention is not limited to this.

Figure 6:
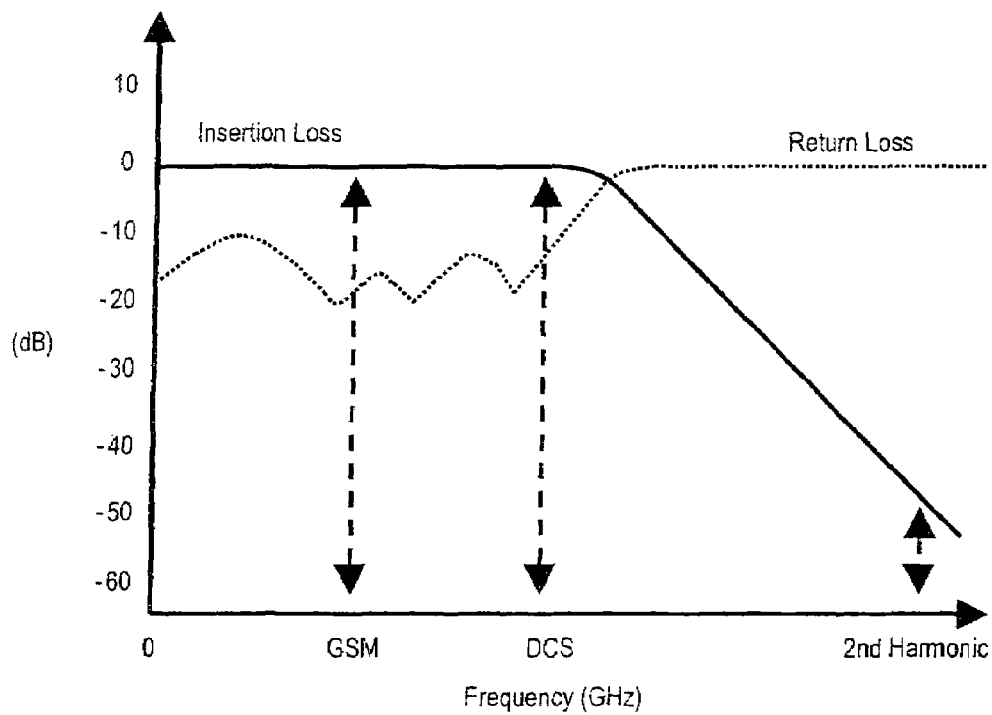
FIG. 6 is a plot illustrating the response of the filter network of FIG. 5 when operating in a first mode.

FIG. 6 shows a plot of the frequency response characteristics of filter 30 when operating in the first mode of operation. The Insertion Loss is similar to that shown in FIG. 2. It is noted that the differences between the respective frequency responses shown in FIGS. 2 and 6 arise primarily as a result of the non-ideal behaviour of diodes 42, 46. Signals in frequency bands up to and including DCS are passed by the filter 30, the −3 dB cut-off point occurring at approximately 1.88 GHz. It is also noted that the second harmonic component of DCS signals (occurring at approximately 3.42 GHz) are significantly attenuated (approximately −56 dB) and therefore effectively removed from the source signal.

In a second mode of operation, a bias voltage is applied (approximately 1 volt in the present example) to the bias input 47 thereby switching on diodes 42, 46. As a result, first and second resonance circuits 39, 43 are operative in the filter 30.

The respective values of components 40, 41, 44, 45 are selected to provide the desired filter response characteristics in the second mode which, in the present embodiment comprises band pass characteristics. In the present example, in the second mode of operation it is desired to pass signal frequencies in the GSM frequency band. The component values L3, C3 may conveniently be determined using, for example, the E-Syn package. For the filter 30 of FIG. 5, the E-Syn package was caused to generate component values for a 2 pole Butterworth band stop filter (of similar topology to the circuit of FIG. 3), the desired band stop being in the GSM band. The resultant value of L3 was adjusted slightly to compensate for the non-ideal behaviour of diodes 42, 46. As is described in more detail below, the series branch 27 of filter 20 (FIG. 3) is inverted in that it is provided in shunt in filter 30 (FIG. 5) as resonant circuit 39. Similarly, the shunt branch 28 of filter 20 may be provided in series in filter 30 (although in practice may be neglected, as described below). In the illustrated embodiment, inductors 40 and 44 have an inductance L3 of approximately 0.5355 nH and capacitors 41 and 45 have a capacitance C3 of approximately 57.614 pF. When an RF signal is received at input 31 in the GSM frequency band, the resonant circuits 39, 43 are caused to resonate and so the filter 30 serves as a band pass filter in the GSM frequency band.

Figure 7:
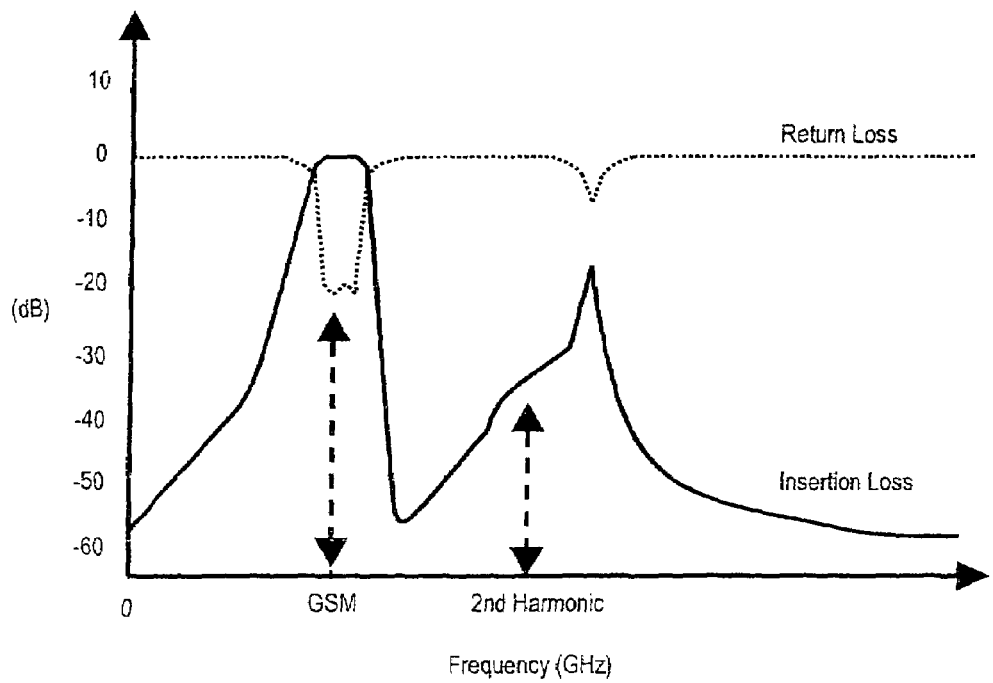
FIG. 7 is a plot illustrating the response of the filter network of FIG. 5 when operating in a second mode.

FIG. 7 shows a plot of the frequency response characteristics of filter 30 in the second operational mode. It will be seen from the Insertion Loss plot that signals in the GSM frequency band are passed by the filter 30 when in the second operating mode. Second harmonic components of GSM signals (approximately 1.8 GHz) are sufficiently attenuated so as to be effectively removed from the signal.

It is considered to be advantageous that the filter 30 operates in the second mode as a band pass filter rather than a low pass filter. This is because, when generating GSM signals in particular, unwanted sub-harmonic signals may be present. As can be seen from FIG. 7, in the second mode, the filter 30 suppresses such sub-harmonic signals—a feat that would not be possible if the filter 30 acted as a low pass filter in the second mode.

Figure 8:
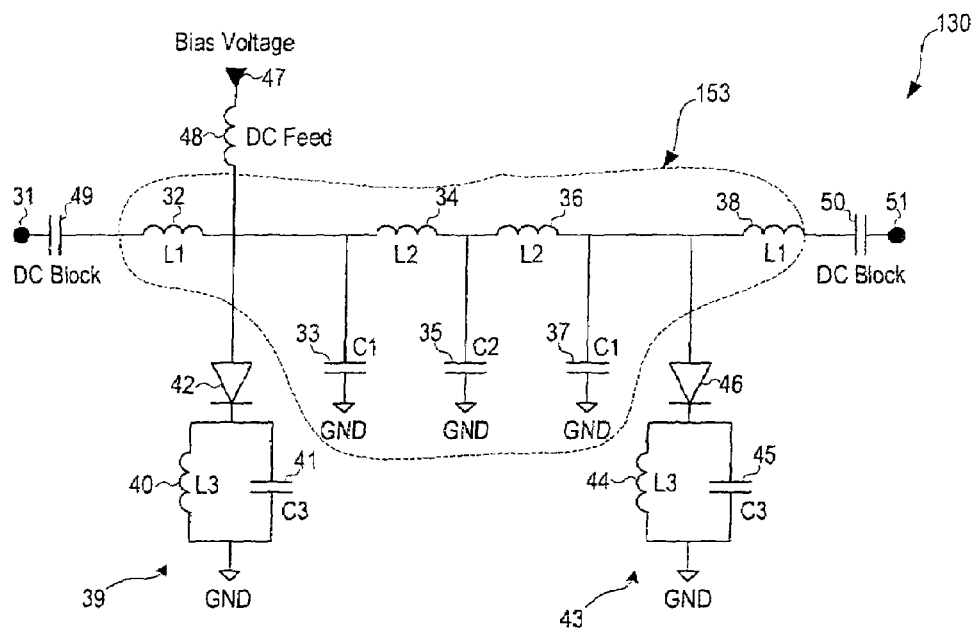
FIG. 8 is a schematic diagram of an alternative embodiment of a filter network according to the invention.
Figure 9:
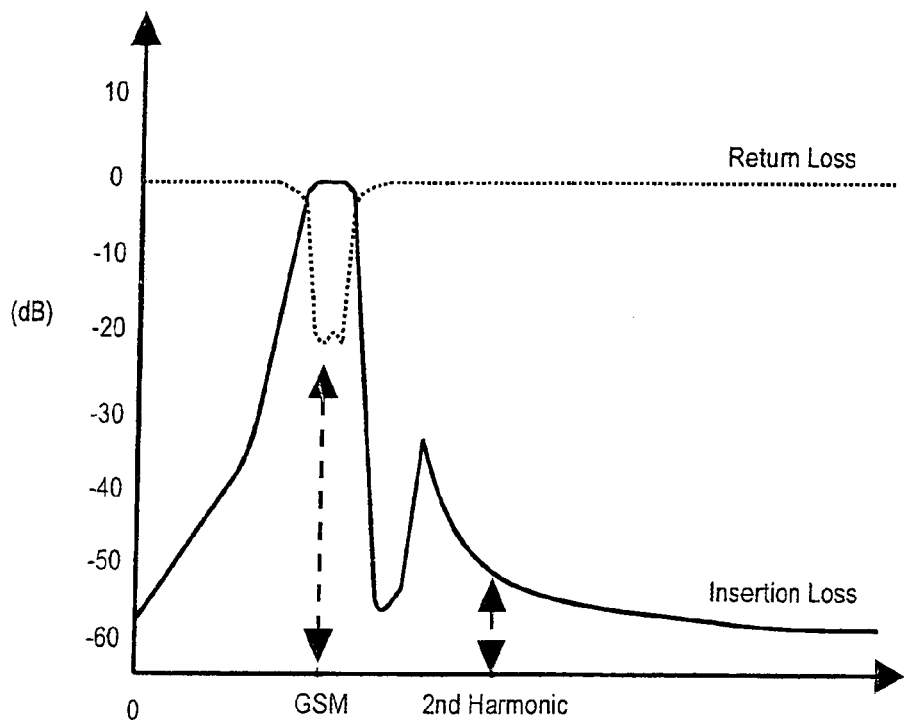
FIG. 9 is a plot illustrating the response of the filter network of FIG. 8 when operating in a first mode.

FIG. 8 illustrates a filter network 130, being an alternative embodiment of the filter 30 of FIG. 5. Filter 130 is generally similar to filter 30 and like numerals indicate like parts. However, in filter 130, the first resonant circuit 39 is provided between the first and second branches of filter component 153, namely between inductor 32 and inductor 34 (or capacitor 33). The component values L1, L2, C1, C2, C3 are the same as for the filter 30. The component value L3 is adjusted slightly to 0.5414 nH. In the first operating mode, this re-positioning of first resonant circuit 39 does not appreciably affect the operation of the filter 130 when compared to the first mode operation of the filter 30 since both resonant circuits 39, 43 are isolated by respective diodes 42, 46. However, in the second operating mode, the filter's 130 performance as a band pass filter in the GSM frequency band is improved. FIG. 9 illustrates the response characteristics of filter 130 in the second mode of operation. It will be seen that the general level of attenuation of Insertion Loss at frequencies above the GSM pass band is increased. It is preferred therefore that the resonant circuits 39, 43 are substantially symmetrically located in the filter 130.

Figure 10:
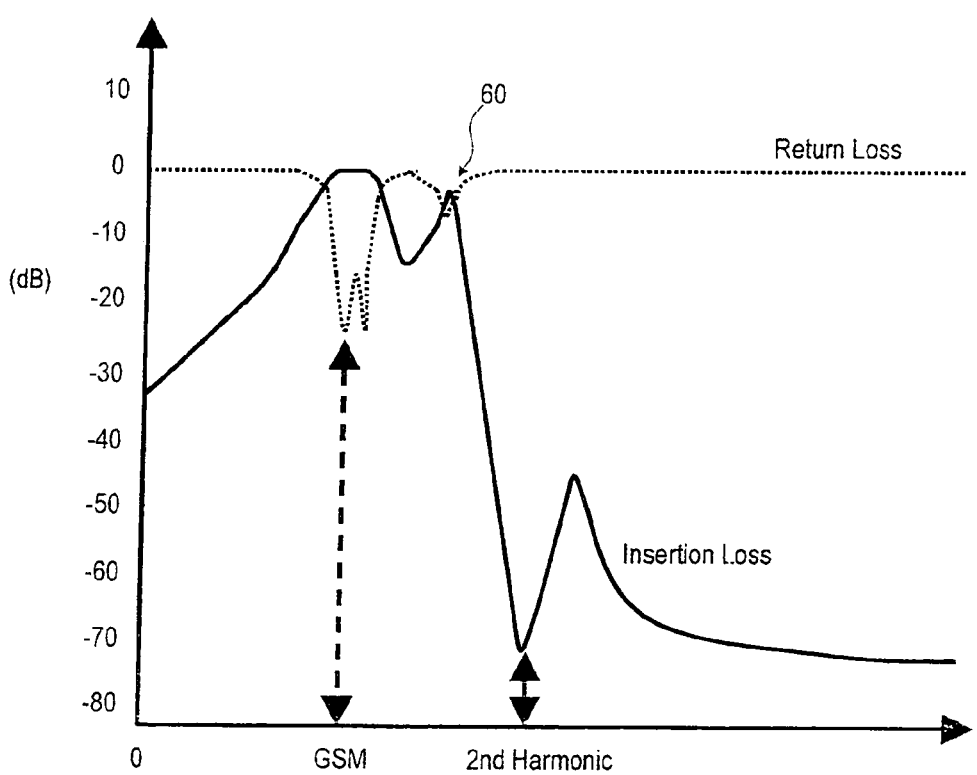
FIG. 10 is a plot illustrating the response of a further alternative filter network.

It will be noted that the general Butterworth band stop filter topology illustrated in FIG. 3 is inverted when incorporated into filters 30, 130. In particular, the circuit branch 27 (FIG. 3) comprising parallel capacitive and inductive elements is incorporated into filter 30, 130 as resonant circuit 39, 43 in shunt with the circuit path between input 31 and output 51 as opposed to in series as shown in FIG. 3. Having a parallel resonant circuit 39, 43 in shunt rather than in series is similar to a general Butterworth band pass filter topology (not shown). Accordingly, an alternative method of determining component values C3, L3 for filters 30, 130 is to design a band pass filter, for example a Butterworth band pass filter, with the pass band in the GSM frequency band. This may conveniently be achieved using E-Syn, or any other conventional filter design product or technique. When E-Syn is used to design a 2 pole Butterworth Band pass filter, the values of L3 and C3 are calculated as approximately 1.784 nH and 17.586 pF respectively. FIG. 10 illustrates the frequency response in the second operation mode when these values of L3 and C3 are used in a filter of the type shown in FIG. 8. It will be seen from the Insertion Loss plot that signals in the GSM frequency band are allowed to pass and that GSM second harmonic frequencies are well suppressed (approximately −72 dB). However, as can be appreciated from the additional peak 60 in the Insertion Loss plot, the overall performance as a band pass filter is not ideal. In particular the additional peak 60 indicates that frequencies above GSM will also be passed by the filter. This is not always acceptable since, in some applications, particularly duplex telecommunication applications, the transmit band and the receive band are very close together and the precision of filter pass bands can therefore be particularly important. Accordingly, it is preferred to select the component values L3, C3 for resonant circuits 39, 43 by designing a band stop filter, particularly a Butterworth band stop filter, and using the parallel resonant circuit in shunt rather than in series. This arrangement is found to pass signals in the GSM frequency band and to provide adequate rejection of GSM second harmonic frequency components while also providing a better overall performance as a band pass filter in the second operating mode.

It will be seen from a comparison of the circuits of FIG. 3 and FIGS. 5 and 8, that the series resonant circuit 28 (FIG. 3) is conveniently omitted from the filters 30, 130. This is possible because the value of inductor 24 is relatively large (approximately 55 nH) and therefore appears substantially as open circuit to high frequency signals. Hence, the omission of the series resonant circuit 28 from filters 30, 130 does not have a significant affect on the operation of the filters 30, 130. For similar reasons, the series resonant circuit 28 can also be omitted if a band pass filter design is used instead of a band stop filter design.

It is not essential to provide both resonant circuits 39, 43 in filters according to the invention. In an alternative embodiment, the filter (not illustrated) may comprise one or other of resonators 39, 43. It is found, however, that when only one resonator 39, 43 is provided, the rejection of the GSM second harmonic components in the second operating mode is relatively poor. For example, in filter 30 of FIG. 5, when the second resonant circuit 43 is removed, the suppression of the GSM second harmonic in the second operating mode is approximately −10 dB and this is inadequate for many commercial applications, particularly in mobile telecommunications. However, a skilled person will appreciate that it may be possible to optimise, using conventional computer optimisation packages, the component values of one or other of the resonators 39, 43 to improve the GSM second harmonic rejection and so remove the need for the other resonator 43, 39.

It can be seen by comparison of FIGS. 5 and 8 that the location of the first resonator 39 may be moved with respect to the inductor 32. Similarly, starting from the filter 130 depicted in FIG. 8, in an alternative embodiment (not illustrated) the point at which the circuit branch comprising the second resonator 43 is connected to the circuit path between input 31 and output 51 is between inductor 38 and capacitor 50. In such an embodiment, the frequency response in the second operating mode is substantially similar to the response illustrated in FIG. 7.

In the embodiments described above, the response characteristics of the filter 30, 130 is altered between the first and second operating modes by switching in or switching out one or more resonant circuits. The filter is thus able to filter signals in different frequency bands depending on the mode of operation.

In a further embodiment, the filter topologies illustrated in FIG. 5 or 8 are used to provide a filter capable of operating in three frequency bands. This is achieved by calculating component values for L1, C1, L2, C2 that cause the filter bandwidth in the first operating mode to extend so that it allows signals in the PCS (Personal Communication systems) frequency band (1850–1910 MHz) to pass as well as signals in the DCS band, while adequately attenuating second harmonic components of PCS and DCS signals. This is achieved by appropriate selection of component values L1, C1, L2, C2 for filter portion 53. Suitable approximate values are as follows: L1=4.6998 nH; C1=2.2645 pF; L2=8.3424 nH; and C2=2.5042 pF. These values may be used in either the filter topology of FIG. 5 or FIG. 8 (the values of L3 and C3 remaining the same as for filters 30, 130) to create a filter which will pass signals in either the DCS or PCS band when in the first operating mode, and in the GSM band in the second operating mode.

Figure 11:
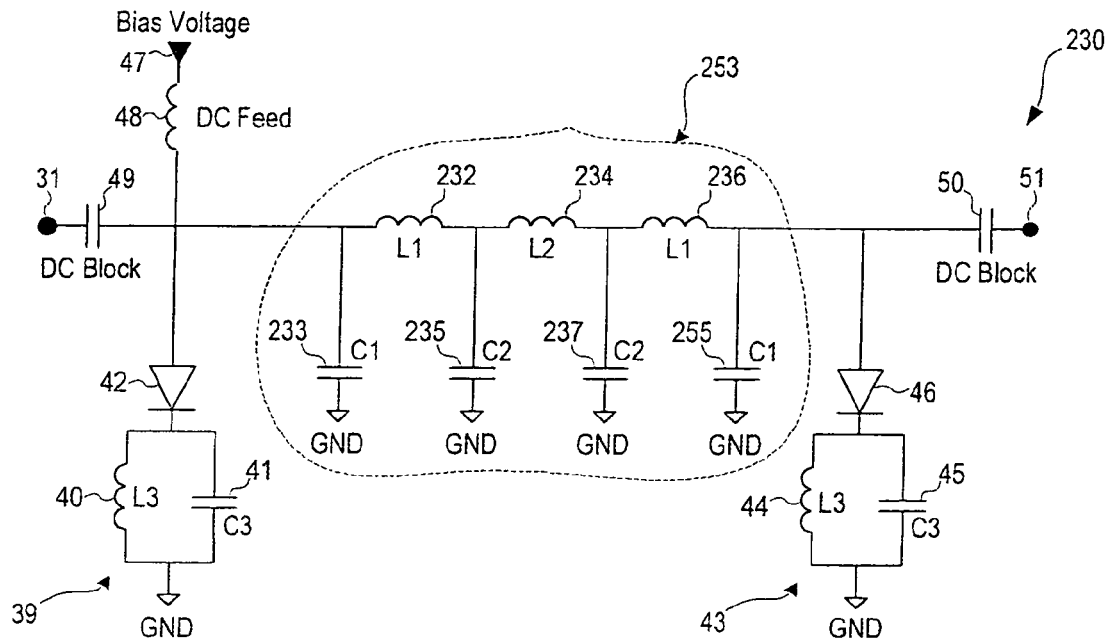
FIG. 11 is a schematic diagram of a further alternative embodiment of a filter network according to the invention.

The invention is not limited to the low pass filter topology shown for filter portion 53 in FIGS. 5 and 8. FIG. 11 shows an alternative embodiment of a filter 230 which is generally similar to filters 30, 130 but which comprises a filter portion 253 having three inductors 232, 234, 236 in series with the circuit path between input 31 and output 51, and four capacitors 233, 235, 237, 255 in shunt between the circuit path and ground as shown in FIG. 11. The inductors and capacitors have values L1, C1, L2, C2 as indicated in FIG. 11. By way of example, in the case where the filter 230 is desired to pass signals in the DCS or PCS frequency bands when in the first operating mode suitable approximate component values are as follows: L1=5.6612 nH; C1=1.8799 pF; L2= 6.2604 nH; C2=3.3370 pF. The values for C3 and L3 are the same as for filters 30, 130 assuming that in the second operating mode filter 230 is desired to pass signals in the GSM frequency band. The topology of filter portion 253 is a 7 pole Chebyshev topology, although the invention is not limited to 7 pole filter topologies or Chebyshev filter topologies.

In a yet further alternative embodiment the filter (not illustrated) is capable of passing signals in more than one frequency band when in the second operating mode. This is achieved using a filter topology of the general type shown in any of FIGS. 5, 8, or 11. The value of the respective inductors and capacitors in each resonator 39, 43 is not the same. Thus, each resonator 39, 43 is arranged to resonate in a different respective frequency band. Typically, the respective frequency bands are adjacent or partly overlapping. This has the effect of broadening the pass band when the filter is in the second operating mode. By way of example, in a filter of the FIG. 8 type, by selecting component values such that the inductance of inductors 40, 44 are approximately 2.3196 nH and 1.7033 nH respectively, and the capacitance of capacitors 41, 45 is approximately 13.0770 pF and 17.686 pF respectively, a filter is created which, in the second operating mode, is capable of passing signals in the GSM frequency band or the AGSM (American GSM) frequency band (824–849 MHz).

It will be understood from the foregoing that by appropriate selection of component values, the filter 30, 130, 230 may be designed to pass signals in up to four different frequency bands depending of the mode of operation. For example, in the first operating mode, the filter 30, 130, 230 may be designed to pass signals in the DCS or PCS band, while in the second operating mode passing signals in the GSM or AGSM bands. A skilled person will also understand that the invention is not limited to the particular frequency bands described herein and that the filter may be arranged to operate in other frequency bands by appropriate selection of component values L1, L2, L3, C1, C2, C3.

The invention is not limited to the use of Chebyshev filter topologies in filter portion 53, 153, 253. For example, Butterworth filter topologies may be used instead. By way of illustration, if a 7 pole Butterworth low pass filter arrangement is used for filter portion 53, 153, 253, the overall filter topology may be the same as for filters 30, 130 or 230.

However, component values are different when designed as a Butterworth low pass filter. For a FIG. 8 type filter with filter portion 153 designed as a Butterworth 7 pole low pass filter, suitable approximate component values are L1=1.425 nH; C1= 1.5971 pF; L2=5.7697 nH; and C2=2.5615 pF for a filter that passing signals up to the DCS band in the first operating mode. For an equivalent filter of the FIG. 11 type, approximate suitable component values are L1= 3.9927 nH; C1=0.57 pF; L2=6.4038 nH; and C2=2.3079 pF. It is preferred, however, to use the Chebyshev topology as described with reference to FIGS. 5, 8 and 11 since a better rejection of second harmonic components is achieved in both operating modes.

Figure 12:
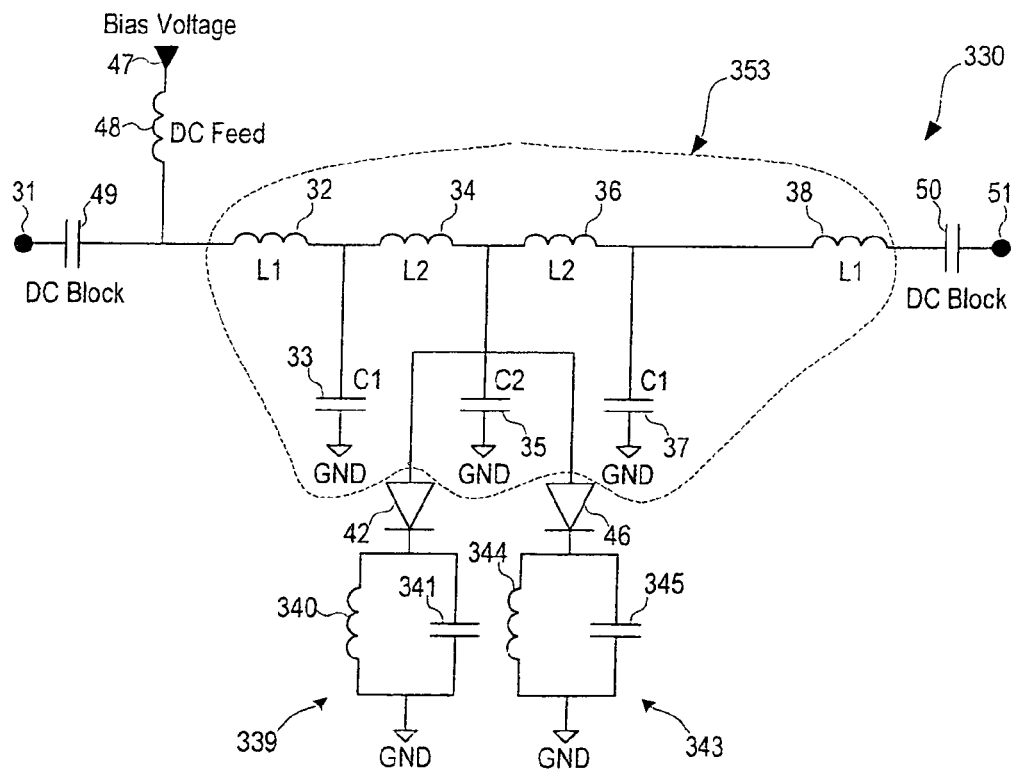
FIG. 12 is a schematic diagram of a still further alternative embodiment of a filter network according to the invention.

The invention is not limited to placement of the resonant circuits on either side of the filter portion 53, 153, 253. For example, in alternative embodiments both resonant circuits may be placed side-by-side on one or other side of the filter portion 53, 153, 253, or one, or both, resonant circuits may be located amidst the branches of filter portion 53, 153, 253. FIG. 12 illustrates an alternative embodiment of a filter 330 in which resonant circuits 339, 343 are located between branches of the filter portion 353. For a DCS/GSM dual mode filter, suitable values of L1, C1 and L2 are the same as for FIG. 8 and a suitable value for C2 is 2.1824 pF. Suitable values for the inductance of inductors 340, 344 are approximately 0.5241 nH and 1.9533 nH respectively, and suitable values for capacitance of capacitors 341, 345 are 59.6141 pF and 16.6862 pF respectively. The embodiment of FIG. 12 is not preferred since the pass band is relatively narrow in the second mode of operation.

The filters 30, 130, 230 of the invention may be used in a wide variety of applications in which filtering is required selectably in one of a number of frequency bands. The invention has particular application, however, in the field of mobile telecommunications as part of, for example, a dual- or multi-band cellular telephone. For example, the filter 30, 130, 230 may be arranged to receive signals from the amplification module, or power amplifier, in the transmit path and may therefore be used as a discrete filter, or be incorporated into a FEM (Front End Module), M-FEM (medium scale FEM) or LS-FEM (large scale FEM). The filter 30, 130, 230 is particularly suitable for use with single-input, single-output amplification modules, or power amplifiers, that are capable of amplifying signals in two or more frequency bands. Such amplification modules are sometimes referred to as broadband or wideband amplifiers. By way of example, the paper "High Efficiency Wideband 6 to 18 GHz PHEMT Power Amplifier MMIC" by Komiak, Kong and Nichols published in the 2002 IEEE MTT-S Digest under section WE3A describes an example of a wideband power amplifier.

Figure 13:
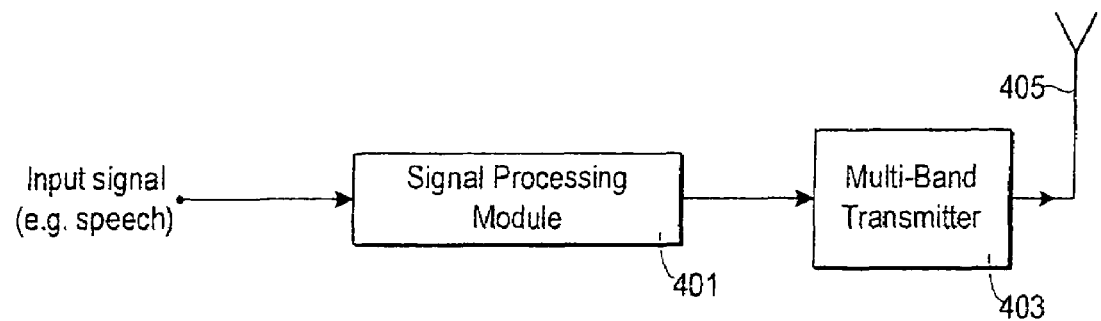
FIG. 13 is a schematic diagram of the transmit path as may be found in a cellular telephone.

Referring to FIG. 13 of the drawings, there is shown in schematic view the transmit path of a wireless communication apparatus such as a mobile, or cellular, telephone (not shown). In the following description, the communication apparatus is assumed to be a cellular telephone although it will be understood that the invention is not limited to use with such. The transmit path includes a multi-band transmitter 403 and a signal processing module 401. The signal processing module 401 is arranged to receive an input signal comprising the information or data to be transmitted from the cellular telephone. The input signal typically comprises a speech signal from a microphone (not shown) or a signal generated from a text message. The signal processing module 401 is arranged to perform conventional signal processing operations, such as speech encoding, channel encoding and carrier signal modulation, on the received input signal.

To this end, the signal processing module 401 typically includes, or is associated with, a respective signal source (not shown) for providing a respective carrier signal in each of the operational frequency bands. Typically, the signal sources comprise voltage controlled oscillators (VCOs) such as RF (Radio Frequency) sources providing RF carrier signals in, for example, the GSM or DCS bands, although it will be appreciated that the carrier signals may alternatively be in other RF or non-RF frequency bands. The signal processing module 401 then provides the processed signal as an input to the transmitter 403. In the present example, it is assumed that the transmitter 403 is a dual-band transmitter and that signal processing module 401 supplies to the transmitter 403 an RF signal comprising a carrier signal, in either the GSM or DCS bands, modulated with, for example, voice or text data.

The main purpose of the transmitter 403 is to amplify the processed signal and to supply the amplified signal to an antenna 405 whereupon it is emitted as a radio signal (assuming an RF carrier). The transmitter 403 and the signal processing module 401 are normally provided on the motherboard (not shown) of the cellular phone.

Figure 14:
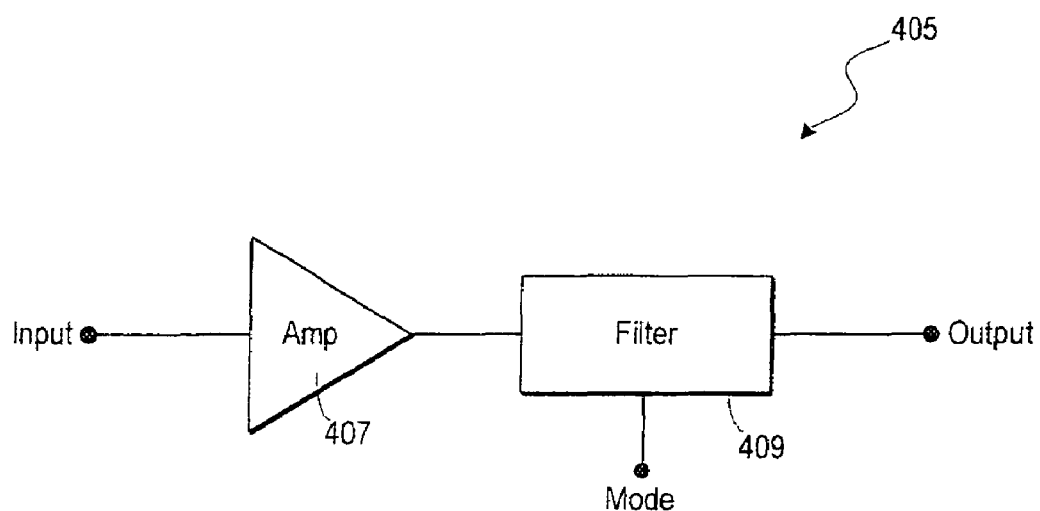
FIG. 14 is a schematic diagram of a multi-band transmitter comprising a filter network of the invention.

It will be appreciated that FIGS. 13 and 14 and the accompanying descriptions provide a simplistic overview of the transmit path and its components. Further detail, being conventional and not required for understanding the present invention, has been omitted for reasons of clarity.

FIG. 14 shows the transmitter 403. The transmitter 403 comprises a single-input, single output (SISO) multi-band power amplifier 407, such as a wideband or broadband power amplifier, and a filter network comprising a multi-mode filter 409 embodying the first aspect of the present invention. By way of example, it is assumed that the amplifier 407 is a dual-band power amplifier capable of amplifying signals in either the GSM or DCS frequency bands. Accordingly, the filter 409 may comprise any of filters 30, 130, 230, 330. The filter 409 includes a mode input corresponding to the signal control input 47. It will be appreciated that the multi-mode filters embodying the invention, also being single-input, single-output (as far as RF signals are concerned) devices are particularly suited for connection to a SISO multi-band power amplifier. Hence, a second aspect of the invention provides a multi-band transmitter comprising a SISO multi-band power amplifier arranged to receive and amplify signals in more than one operational frequency band, and a multi-mode filter according to the first aspect of the invention arranged to filter the output of the amplifier.

It will be understood, that filters 30, 130, 230, 330 are relatively versatile and, as illustrated herein, can readily be arranged to pass selectably signals in up to four operational frequency bands. The general topology of the filters 30, 130, 230, 330 is relatively simple and the filters are therefore, when implemented, relatively small. Moreover, because the filters 30, 130, 230, 330 may be constructed using filter portions based on standard filter topologies, for example Butterworth or Chebyshev topologies, the inductive and capacitive component values may readily be calculated using standard low pass, band pass and/or band stop design techniques.

It is also advantageous that the operational characteristic of the filters 30, 130, 230, 330 switches between low pass and band pass in respective modes as this allows an extra degree of freedom when designing the filter—for example where it may be desirable to filter using a band pass characteristic in one operational mode and using a low pass characteristic in another operational mode. In this connection, it is not essential that the band pass mode corresponds with the lower operational frequencies and that the low pass mode corresponds with the higher operational frequencies as illustrated by filters 30, 130, 230, 330 (although this arrangement is suited to a GSM/DCS filter). A skilled person will appreciate that the component values of filters 30, 130, 230, 330 may alternatively be calculated so that the band pass mode corresponds with the higher operational frequencies and the low pass band corresponds with the lower operational frequencies.

The change in filter type between modes (i.e. the change between band pass and low pass) is effected by selectably adding or isolating one or more resonant circuits, or resonators, to the filter depending on the setting of a switch. In the illustrated embodiments, the, or each, resonant circuit comprises a parallel LC resonant circuit. This is preferred as it facilitates selection of component values using standard design techniques, e.g. Butterworth or Chebyshev design techniques. However, the resonant circuit could take alternate forms, for example a series LC resonant circuit (not shown).

The filters 30, 130, 230, 330 do not give rise to any unusual impedance matching considerations and may readily be incorporated into conventional systems—for example a typical 50 Ohm input load, 50 Ohm output load system—in the normal manner.

The filters 30, 130, 230, 330 may be implemented in any conventional manner including PCB (printed circuit board) and surface mount technology, or as a dielectric block filter, although the use of multilayer substrate technology is preferred.

The invention is not limited to the embodiments described herein which may be modified or varied without departing from the scope of the invention.

What is claimed is:

1. A filter network comprising an input for receiving a signal to be filtered, an output for providing a filtered signal, a plurality of circuit branches providing a single circuit path for carrying said signal between the input and the output, each circuit branch comprising one or more filter elements, and at least one resonant circuit associated with a switch device, the switch device being operable between an on state, in which said at least one resonant circuit is connected to said circuit path thereby affecting how said single circuit path filters the signal, and an off state in which said at least one resonant circuit is substantially isolated from said circuit path thereby not substantially affecting how said single circuit path filters the signal; and a switch control input for receiving a signal for operating the switch device between the on and off states.

2. A filter network as claimed in claim 1, wherein said at least one resonant circuit is arranged between said circuit path and ground.

3. A filter network as claimed in claim 1, wherein said switch device comprises a diode and said switch control input is arranged to receive a bias voltage signal for turning the diode on or off.

4. A filter network as claimed in claim 3, wherein said switch device is provided between said at least one resonant circuit and said circuit path.

5. A filter network as claimed in claim 4, wherein said at least one resonant circuit is connected to the cathode of the diode and the anode of the diode is connected to said circuit path, said switch control input being arranged to supply said bias voltage signal to the cathode.

6. A filter network as claimed in claim 1, wherein said filter elements comprise capacitive elements or inductive elements.

7. A filter network as claimed in claim 6, wherein said at least one resonant circuit comprises a capacitive element and an inductive element arranged in parallel with one another.

8. A filter network as claimed in claim 6, for passing, when in one mode of operation, signals which are received at said input in a first frequency band, wherein the respective values of capacitance and inductance of the respective filter elements in said at least one resonant circuit are selected to cause said resonant circuit to resonate in said first frequency band.

9. A filter network as claimed in claim 8, wherein said capacitance and inductance values are selected by designing the resonant circuit as at least part of a band stop filter in which the stop band substantially comprises said first frequency band.

10. A filter network as claimed in claim 9, wherein the resonant circuit is designed as part of a Butterworth band stop filter.

11. A filter network as claimed in claim 1, wherein the filter network includes a filter portion comprised of some of said circuit branches, said filter portion being arranged to behave as a low pass filter for passing signals of frequencies up to and including a cut-off frequency.

12. A filter network as claimed in claim 11, wherein the filter portion comprises two or more of said circuit branches arranged alternatively in series with the circuit path or in shunt between the circuit path and ground.

13. A filter network as claimed in claim 11, wherein the filter network is operable in a first mode, corresponding to when the switch device is on, in which the filter network behaves as a band pass filter passing signals in said first frequency band, and a second mode, corresponding to when the switch device is off, in which the filter network behaves as a low pass filter passing signals up to and including said cut-off frequency.

14. A filter network as claimed in claim 13, wherein the first frequency band is lower than the cut-off frequency.

15. A filter network as claimed in claim 11, wherein the circuit branches of said filter portion are arranged in a Chebyshev low pass filter topology.

16. A filter network as claimed in claim 11, wherein said at least one resonant circuit is connectable to said circuit path at a point between the filter portion and one or other of said input or output.

17. A filter network as claimed claim 11, wherein said filter portion has a first circuit branch comprising an inductor in series with the circuit path and a last circuit branch comprising an inductor in series with the circuit path, the remainder of the filter portion being located between said first and last inductors, and wherein said at least one resonant circuit is connectable to the circuit path between one of said first or last inductors and the remainder of the filter portion.

18. A filter network as claimed in claim 11, wherein said at least one resonant circuit includes a first resonant circuit and a second resonant circuit, the filter network further including a respective switch device for connecting a respective one of said first and second resonant circuits to said circuit path and switch device connects the other of said first and second resonant circuits to said circuit path.

19. A filter network as claimed in claim 18, wherein the first and second resonant circuits are connectable to the circuit path at respective points such that the filter portion is located between said first and second filter branches.

20. A filter network as claimed in claim 18, wherein the first and second resonant circuits are arranged to resonate in substantially the same frequency band.

21. A filter network as claimed in claim 18, wherein first and second resonant circuits are arranged to resonate in respective frequency bands, the frequency bands being adjacent or partly overlapping.

22. A multi-band transmitter comprising a single-input, single-output multi-band power amplifier arranged to receive and amplify signals in more than one operational frequency band, and a filter network as claimed in claim 1, the arrangement being such that the input of the filter network receives signals produced by the output of the multi-band power amplifier.

* * * * *